(12) United States Patent
Buynoski et al.

(10) Patent No.: US 6,207,553 B1
(45) Date of Patent: Mar. 27, 2001

(54) METHOD OF FORMING MULTIPLE LEVELS OF PATTERNED METALLIZATION

(75) Inventors: Matthew S. Buynoski, Palo Alto; Ming-Ren Lin, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/237,258

(22) Filed: Jan. 26, 1999

(51) Int. Cl.[7] .................. H01L 21/4763; H01L 21/44
(52) U.S. Cl. ................ 438/622; 438/638; 438/640; 438/645; 438/673
(58) Field of Search ..................... 438/622, 625, 438/638, 648, 626, 629, 652, 675, 673, 676, 666, 669, 672, 645

(56) References Cited

U.S. PATENT DOCUMENTS

| 4,490,210 | * | 12/1984 | Chen et al. ............... 216/65 |
| 4,643,799 | * | 2/1987 | Tsujii et al. ............... 216/65 |
| 4,684,437 | | 8/1987 | Donelon et al. . |
| 5,100,499 | | 3/1992 | Douglas . |
| 5,110,394 | | 5/1992 | Ogawa . |
| 5,366,911 | * | 11/1994 | Lur et al. ............... 438/282 |
| 5,500,079 | * | 3/1996 | Nishizawa et al. ............ 438/708 |
| 5,534,107 | | 7/1996 | Gray et al. . |
| 5,607,601 | | 3/1997 | Loper et al. . |
| 5,643,472 | | 7/1997 | Engelsberg et al. . |
| 5,683,547 | | 11/1997 | Azuma et al. . |
| 5,821,168 | * | 10/1998 | Jain ...................... 438/692 |
| 5,882,963 | * | 3/1999 | Kerber et al. ............... 438/195 |
| 6,051,884 | * | 4/2000 | Papadas .................. 257/774 |
| 6,060,347 | * | 5/2000 | Wang .................... 438/215 |

FOREIGN PATENT DOCUMENTS

411204520 * 7/1999 (JP) .

* cited by examiner

*Primary Examiner*—Charles Bowers
*Assistant Examiner*—Brook Kebede (57) ABSTRACT

Submicron-dimensioned metallization patterns are formed on a substrate surface by a photo-activated selective, anisotropic etching process, wherein selective portions of a metal layer are exposed to collimated UV passing through a pattern of submicron-sized openings in an overlying exposure mask. At least one photo-activatable etching material contained in a gas flowed through the space between the substrate surface and the mask selectively and anisotropically etches the exposed portions of the metal layer in thereby avoiding numerous masking and etching steps as in conventional photolithographic methodology. The inventive method is of particular utility in performing multi-level, in-laid, "back-end" metallization processing of high-density integrated circuit semiconductor devices.

19 Claims, 3 Drawing Sheets

METHOD OF FORMING MULTIPLE LEVELS OF PATTERNED METALLIZATION

FIELD OF THE INVENTION

The present invention relates to a method of forming multiple levels of patterned metal layers on a surface of a substrate, each of the metal patterns comprising a plurality of spaced-apart, submicron-dimensioned features in-laid in a surface of a layer of dielectric material, with selected features of an underlying metallization level in ohmic contact with selected features of one or more overlying metallization levels. More particularly, the present invention relates to a highly efficient, simplified method of manufacturing high-density, multi-metallization layer semiconductor integrated circuit devices at lower cost and with reliable interconnection patterns. The present invention enjoys particular industrial applicability in manufacturing high-density, multi-metallization level integrated circuit semiconductor devices having design features of 0.18 μm and under, e.g., 0.13 μm.

BACKGROUND OF THE INVENTION

The present invention relates to a method of forming patterned metal films wherein the pattern includes submicron-dimensioned features. The present invention of particular utility in integrated circuit semiconductor device manufacture, and is especially adapted for use in "back-end" processing for forming multiple levels of in-laid metallization patterns.

The escalating requirements for high density and performance associated with ultra large-scale integration (ULSI) semiconductor device wiring are difficult to satisfy in terms of providing submicron-dimensioned (e.g., below about 0.18 μm), low RC time constant metallization patterns, particularly wherein the submicron-sized metallization features such as vias, contact areas, grooves, trenches, etc., have high aspect (i.e., depth-to-width) ratios due to the increasing demands of microminiaturization.

Figure 1:
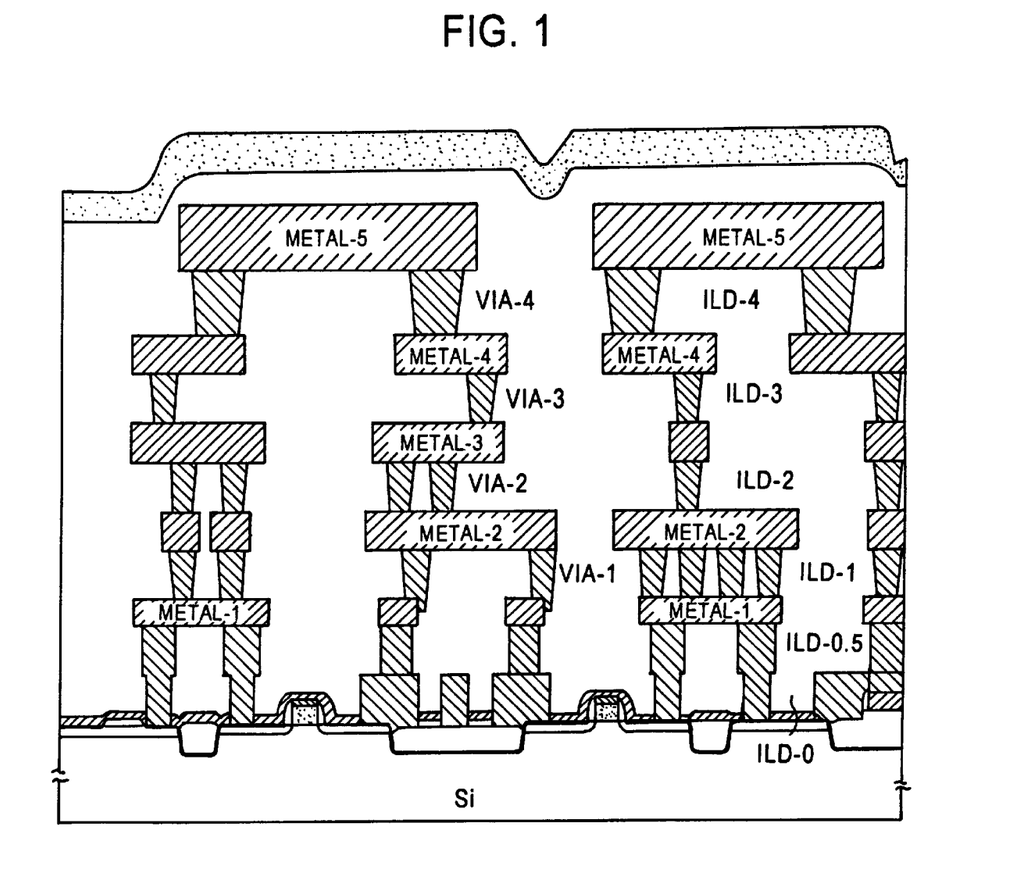
FIG. 1 illustrates, in simplified, cross-sectional form, a portion of a multi-metallization layer "back-end" contact/interconnect structure of an integrated circuit semiconductor device.

The present invention is applicable in manufacturing various types of semiconductor devices, such as the type illustrated in FIG. 1, which comprises a semiconductor wafer substrate, usually of doped monocrystalline silicon (Si), having at least one active device region or component (e.g., an MOS type transistor, a diode, etc.) formed therein or thereon, and a plurality of sequentially formed inter-layer dielectrics (ILDs) and patterned conductive layers (METALs) formed therein and/or therebetween. An integrated circuit is formed therefrom containing a plurality of patterns of conductive lines separated by interwiring spacings, and a plurality of interconnection lines, such as bus lines, bit lines, word lines, and logic interconnect lines. Typically, the conductive patterns of vertically spaced apart metallization layers are electrically interconnected by a substantially vertically oriented conductive plug (termed "VIA") filling a via hole formed in the ILD separating the metallization layers, while another conductive plug filling a contact area hole establishes ohmic contact with an active region (e.g., a source/drain region of an MOS type transistor) formed in or on the semiconductor substrate. Conductive lines formed in groove or trench-like openings in overlying dielectric layers extend substantially parallel to the semiconductor substrate. Semiconductor devices of such type as illustrated in FIG. 1 and fabricated according to current technology may comprise five or more levels of such metallization in order to satisfy device geometry and miniaturization requirements.

Electrically conductive films or layers of the type used in "back-end" semiconductor manufacturing technology as required for fabrication of devices such as described above and illustrated in FIG. 1 typically comprise a metal such as titanium, tantalum, tungsten, molybdenum, aluminum, chromium, nickel, cobalt, palladium, silver, gold, copper, and their alloys. However, conventional methodology for performing "back-end" metallization processing utilizing any of the enumerated metals presents several disadvantages and drawbacks. Specifically, such conventional "back-end" processing is complex, difficult, costly, time consuming, and entails a significant reduction in interconnection reliability and product yield as feature sizes decrease and the number of metallization levels increases. For example, a typical damascene-type process performed according to the conventional art for forming a single via/metallization pair can involve as much as forty (40) separate processing steps, including, inter alia, formation of a photoresist layer on a first dielectric layer; selective exposure of the photoresist through a patterned mask; development of the exposed photoresist to form a patterned photoresist; selective etching of the patterned resist-coated dielectric layer to form a via hole pattern therein; filling of the via holes with metal plugs; deposition and planarization of a dielectric gap-fill layer to form a second dielectric interlayer; photoresist formation thereon; selective exposure and development of exposed photoresist to form a pattern of openings or recesses therein corresponding to the desired metallization pattern; filling of the recesses with the selected metal, including formation of a blanket or overburden layer of excess thickness to ensure complete filling of the recesses; removal of the blanket or overburden layer; and planarization of the remaining dielectric layer surface to form an in-laid metallization pattern. Inasmuch as the formation of each additional via/metallization pair adds an additional approximately forty (40) process steps, it is evident that repetition of the above-described sequence of steps up to, e.g., fifteen (15) times, for forming high integration density, multi-metallization level semiconductor devices, entails significant cost, great manufacturing complexity, and increased likelihood of occurrence of defects and reliability problems, as well as reduced product yield. Furthermore, non-damascene type processes for forming in-laid metallization patterns, e.g., processes comprising blanket deposition of metal layers, selective removal thereof by means of photolithographic masking and etching techniques to define desired metallization patterns therein, dielectric gap-fill layer deposition, and planarization thereof, are equally difficult, complex, expensive, and subject to the above-enumerated drawbacks associated with damascene-type processing, including increased likelihood of defect formation, and reduced reliability and product yield.

Thus, there exists a clear need for an efficient, simplified method for forming multiple levels of in-laid "back-end" metallization patterns at reduced cost, increased reliability and product yield, and which does not entail the complexity and drawbacks associated with conventional in-laid metallization processing. Specifically, there exists a need for an improved method of forming such metallization patterns in submicron-sized dimensions, for forming contacts, vias, interconnection routings, etc., which method is fully compatible with conventional process flow and methodology in the manufacture of ultra large-scale, high integration density integrated circuit semiconductor devices.

The present invention fully addresses and solves the above described problems and drawbacks attendant upon conventional processing for manufacturing integrated circuit semiconductor devices requiring multiple metallization levels, particularly in providing a very significant, dramatic reduction in the number of requisite processing steps from about 40 to about 8 for each via/metallization pair, thereby significantly reducing manufacturing costs, increasing product reliability and yield, and dramatically increasing production throughput. These significant advantages are achieved while providing full compatibility with the balance of device manufacturing process flow and methodology.

DISCLOSURE OF THE INVENTION

An advantage of the present invention is an efficient, simplified method for forming an in-laid patterned metal layer on a substrate surface, wherein the pattern includes a plurality of spaced-apart, submicron-dimensioned metal features.

Another advantage of the present invention is an efficient, simplified method for forming multiple levels of in-laid, patterned metallization.

Still another advantage of the present invention is a method of manufacturing a semiconductor device with one or more in-laid metallization patterns at lower cost and with higher manufacturing throughput and increased product yield than obtainable with conventional process methodology.

Yet another advantage of the present invention is a simplified method of manufacturing an integrated circuit semiconductor device utilizing in-laid "back-end" contacts and interconnections, at reduced manufacturing cost and with improved product quality, reliability, and reduced defects.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are achieved in part by a method of manufacturing a semiconductor device, which method comprises the sequential steps of:

(a) providing a substrate comprising a semiconductor wafer, the wafer including a surface having a dielectric layer formed thereover, the surface of the dielectric layer comprising a first in-laid metallization pattern including a plurality of spaced-apart metal features forming electrical contacts, vias, interlevel metallization, and/or interconnect routing of at least one active device region or component of said wafer substrate;

(b) forming a layer of a preselected metal to a predetermined thickness over the surface of the dielectric layer and in ohmic contact with each of the plurality of metal features of the first in-laid metallization pattern;

(c) positioning a patterned exposure mask at a predetermined height spacing from the surface of the metal layer, the mask comprising a predetermined pattern of openings formed therethrough, the mask openings being positioned in a predetermined registered relation with the features of the first in-laid metallization pattern;

(d) establishing a gas atmosphere in the space between the surface of the metal layer and the patterned exposure mask, the gas atmosphere comprising at least one etchant material for photo-activated etching of the metal layer;

(e) irradiating the portions of said gas atmosphere exposed through the pattern of mask openings with radiation of predetermined wavelength(s) for effecting photo-activated, selective, anisotropic etching of the portions of the metal layer exposed through the pattern of mask openings; and (f) continuing the photo-active selective anisotropic etching of step (e) for an interval sufficient to remove the entire thickness of the metal layer at the exposed portions thereof, thereby forming a patterned metal layer having predetermined portions in overlying, ohmic contact with preselected features of the first in-laid metallization pattern.

Embodiments of the present invention further comprises:

(g) depositing a layer of a dielectric material filling the gaps or spaces between adjacent features of the patterned metal layer, the dielectric material being blanket-deposited in an excess thickness over the patterned metal layer; and (h) removing the excess thickness of the dielectric material layer and planarizing the surface thereof to form a second in-laid metallization pattern.

Embodiments of the present invention further comprise repeating steps (b)–(h) n times to form n additional in-laid metallization patterns, with n being an integer from 1 to 15; step (b) comprises forming an about 4,000 to about 10,000 Å thick layer of metal selected from titanium, tantalum, tungsten, molybdenum, aluminum, chromium, nickel, cobalt, palladium, silver, gold, copper, and alloys thereof, preferably copper and its alloys; the metal layer is formed by a process selected from electroplating, electroless plating, physical vapor deposition (PVD), chemical vapor deposition (CVD), plasma enhanced CVD (PECVD), and combinations thereof, the in-laid metallization patterns include submicron-dimensioned metal features having widths less than about 0.40 µm, preferably less than about 0.27 µm (at present), depths of from about 4,000 to about 10,000 Å, and spacings of from about 0.108 to about 0.40 µm; step (c) comprises positioning a patterned exposure mask having corresponding openings at a spacing from the metal layer surface; step (d) comprises establishing a gas atmosphere comprising at least one photo-activated anisotropic etching material selected from halogens and halogen-containing compounds; step (e) comprises irradiating the exposed portions of the at least one photo-activated etching material with collimated radiation having wavelengths in the ultra-violet (UV) region of the electromagnetic spectrum, the irradiation being either continuous or pulsed; step (g) comprises depositing a blanket layer of a dielectric material having a low dielectric constant below about 3.9, selected from hydrogen silsesquioxane (HSQ), benzocyclobutene (BCB), polytetrafluoroethylene, parylene, polyimide, and xerogel; step (h) comprises removing the excess thickness of the layer of low dielectric material and planarizing the surface thereof by chemicalmechanical polishing (CMP).

According to another aspect of the present invention, silicon semiconductor integrated circuit devices comprising multiple levels of in-laid, "back-end" metallization patterns formed by repetition of steps (b)–(h) n times are provided, wherein n is an integer from 1 to 15.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will be described and become apparent, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWINGS

The following detailed description of the present invention can best be understood when read in conjunction with the following drawings, wherein.

DESCRIPTION OF THE INVENTION

The present invention addresses and solves problems arising from manufacturing integrated circuit semiconductor devices, wherein, as part of the fabrication methodology, a plurality of metallization layers separated by dielectric layers, are formed during "back-end" processing for providing contacts, interconnections, routing patterns, etc., to at least one active device region or component of a semiconductor wafer substrate. More specifically, the present invention advantageously provides a significant and substantial reduction in the number of individual process steps required for the formation of multi-level metallization patterns compared to conventional processing methodology, thereby increasing reliability while reducing manufacturing costs and product yield problems associated with the conventional technology. In addition. the inventive method is fully compatible with other aspects of existing processing methodology and provides increased manufacturing throughput vis-à-vis conventional damascene type electroplating and CMP processing.

Briefly stated, according to the present invention, a metal layer is formed over the surface of a semiconductor wafer substrate in ohmic contact with the features of an underlying in-laid metallization pattern formed thereon. The metal layer is then patterned by a selective anisotropic etching process wherein an exposure mask having a predetermined pattern of openings is placed over the metal layer in spaced relation therewith, with the pattern of openings being in a predetermined registered relation with the features of the in-laid metallization pattern. A gas atmosphere comprising at least one photo-activated anisotropic etching material is then established in the space between the metal layer and the exposure mask. The portions of the gas atmosphere exposed through the pattern of mask openings are irradiated with radiation of predetermined wavelength(s) for effecting photo-activated, selective anisotropic etching of the portions of the metal layer exposed through the pattern of mask openings. Etching is continued for an interval sufficient to remove the entire thickness of the metal layer at the exposed portions, thereby forming a patterned metal layer having predetermined portions in overlying, ohmic contact with selected features of the in-laid metallization pattern. A blanket layer of dielectric material filling the gaps or spaces of the patterned metal layer is then deposited in an excess thickness, followed by removal of the excess thickness and planarization to form a second level of in-laid metallization. The inventive process may be repeated as desired, typically up to about four (4) or five (5) times, to form a five-or six-level "back-end" metallization structure.

The inventive process is thus capable of forming semiconductor devices comprising several levels of selectively interconnected and patterned metallization without requiring separate steps for via hole and metal plug formation, as well as eliminating numerous steps for photolithographic masking and etching required for conventional processing methodology. In an embodiment according to the invention, formation of one (1) level of in-laid metallization requires only four (4) steps. As a consequence of the inventive methodology, the number of process steps for forming, e.g., two (2) vertically spaced apart, selectively interconnected layers of patterned metal conductors, is dramatically and significantly reduced from approximately forty (40) steps as with conventional methodology, to eight (8) steps.

Figure 2A:
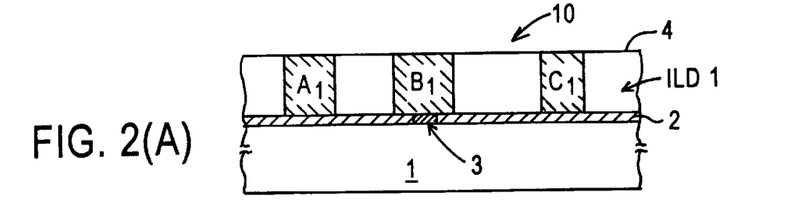
FIGS. 2(A)–2(E) illustrate, in simplified, cross-sectional form, a sequence of steps for forming one level of in-laid, patterned, "back-end" metal contact/interconnect structure according to an embodiment of the present invention.

Referring now to FIGS. 2(A)–2(E), a sequence of steps for performing an illustrative, but not limitative, embodiment of the present invention is shown therein. Referring more particularly to FIG. 2(A), in a first step, a substrate 10 comprising a semiconductor wafer 1 (e.g., of doped monocrystalline silicon, Si) is provided, which wafer substrate may, for example, contain transistors, diodes, and other semiconductor elements (not shown for illustrative simplicity) as are well known in the art. Semiconductor wafer 1 may also contain metal interconnect layers, also not shown for simplicity. Insulator layer 2, e.g., of silicon dioxide, is formed on the surface of the semiconductor wafer 1 to electrically isolate the device structures and features of semiconductor wafer 1 from overlying interconnect lines $A_1$, $B_1$, and $C_1$, shown, for illustrative purposes, as having different widths. Also shown for illustrative purposes only, is contact 3 extending through insulator layer 2 for connecting interconnect line $B_1$ to semiconductor wafer body 1. The spaced-apart interconnect lines $A_1$, $B_1$, and $C_1$ are made of an electrically conductive material such as metal (e.g., aluminum, copper, titanium, tantalum, etc., or alloys thereof) and typically have widths less than about 0.40 $\mu$m, e.g., about 0.27 $\mu$m (at present), depths of from about 4,000 to about 10,000 Å, and inter-line spacings of from about 0.10 to about 0.40 $\mu$m. Inter-layer dielectric layer ILD-1 comprises a low dielectric constant material (i.e., k <3.9) and isolates interconnect lines $A_1$, $B_1$, and $C_1$ from each other and may comprise any of the low k materials conventionally employed for such purpose, e.g., organic polymers such as polytetrafluoroethylene (TEFLON™) , hydrogen silsesquioxane (HSQ), benzocyclobutene (BCB), parylene, polyimide, etc.

Figure 2B:
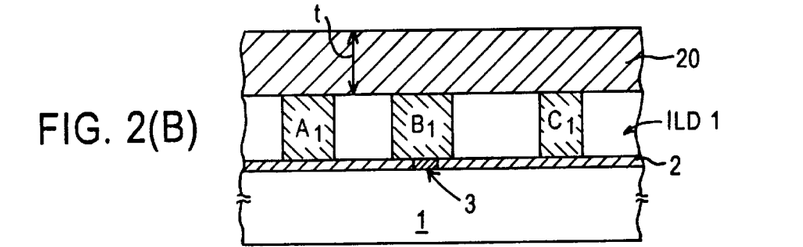

Referring now to FIG. 2(B), in a first step according to the inventive method, a metal blanket layer 20 for comprising a second level of metallization is deposited on the entire upper surface 4 of substrate 10 to a predetermined thickness t of from about 4,000 to about 10,000 Å. Layer 20 may comprise any of the metals conventionally employed for such metallization purpose, e.g., titanium, tantalum, tungsten, molybdenum, aluminum, chromium, nickel, cobalt, palladium, silver, gold, copper, and their alloys, preferably copper and its alloys. Layer 20 may be deposited by one or more conventional techniques, e.g., electroplating, electroless plating, physical vapor deposition (PVD), chemical vapor deposition (CVD), and plasma enhanced CVD (PECVD), as determined by the particular metal.

Figure 2C:
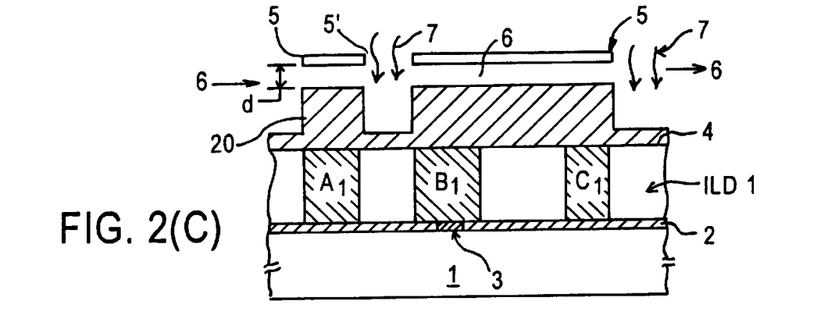

Referring now to FIG. 2(C), in a second step according to the inventive method, substrate 10 with second metallization level layer 20 formed thereon is then subjected to a selective, photo-activated, anisotropic etching process for forming a predetermined pattern of spaced-apart, submicron-dimensioned features (e.g., $A_2$, $D_2$, etc.) in ohmic contact with selected ones of the metal features of the underlying (i.e., first) in-laid metallization pattern, e.g., features $A_1$, $B_1$, and $C_1$. This step of the inventive process sequence is similar, in part, to the photolytic pattern etching processes described in U.S. Pat. Nos. 5,100,499; 5,607,601; 5,683,547; 5,110,394; 4,684,437; and 5,534,107, the entire disclosures of which are incorporated herein by reference, which processes are improved and modified as hereinbelow described for use as part of a process sequence of particular utility in forming multiple levels of metal patterns having submicron-sized dimensions.

Figure 2D:
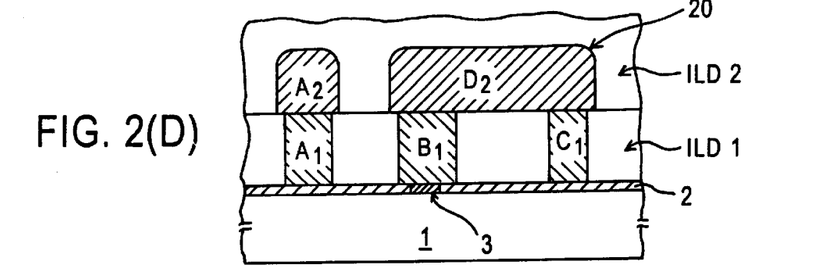

As shown in FIG. 2(C), an exposure mask 5 (e.g., formed at least at its exposed surfaces of a substantially etch-resistant material) comprising a predetermined pattern of submicron-dimensioned openings 5', is positioned at a spacing d, e.g., of about 1 meter above the surface of metal layer 20 when employing a conventional refractive lens-stepper optical system. A gas 6 comprising at least one photo-activated anisotropic etching material selected from halogens and/or halogen-containing compounds is flowed through the space d between the surface of metal layer 20 and the lower surface of mask 5. Collimated electromagnetic radiation 7 of suitable energy for photo-activation of the etching material(s) from a source (not shown) selectively photo-activates the at least one etching material at locations exposed by the pattern of mask openings 5'. In turn, the at least one etching material selectively photo-activated in the regions of the mask openings 5' anisotropically etches the underlying metal layer 20 at such regions, FIG. 2(C) illustrating a state prior to completion of the selective etching process. Upon completion of the etching, i.e., when the surface 4 of dielectric layer ILD-1 is exposed at the bottoms of the etched regions as is shown in FIG. 2(D), a patterned metal layer 20 (i.e., a second metallization level) having submicron-sized features (e.g., $A_2$, $D_2$) is resultingly selectively formed in overlying ohmic contact with one or more of the underlying features $A_1$, $B_1$, and $C_1$ of the first (in-laid) metallization level. As should be apparent, the intra- and inter-level interconnect patterns which can be formed (without requiring separate via formation) by the inventive method are highly variable according to the particular mask pattern utilized. Thus the illustrated pattern wherein metal segment or feature $A_2$ contacts only the underlying interconnect line $A_1$, whereas metal segment or feature $D_2$ contacts interconnect lines $B_1$ and $C_1$, is but one example demonstrating the extreme versatility and simplicity of the inventive method.

With continued reference to FIG. 2(D), in a third step according to the inventive method, following completion of the selective photo-activated patterning of second metal layer 20, a second "low-k" gap-fill layer ILD-2 of a material similar to that used for first interlayer dielectric layer ILD-1 is deposited thereover in blanket form in excess thickness so as to overfill the gaps or spaces between adjacent metal features and subjected to a fourth processing step comprising planarization, as by conventional techniques, e.g., CMP. The resulting planarized structure having a second in-laid metallization or conductor pattern based upon second metal layer 20 is shown in FIG. 2(E).

Figure 2E:
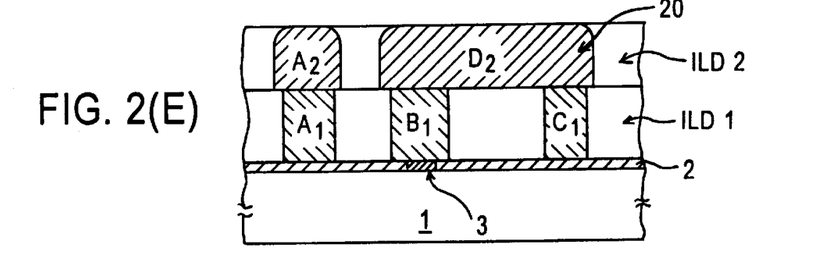

The planarized structure of FIG. 2(E) may itself then be subjected to a repeat of the inventive 4-step processing sequence to form an additional (i.e.,$3^{rd}$) selectively patterned metallization level overlying and selectively ohmically contacting/interconnecting features of the underlying $2^{nd}$ metallization level. The above-described 4-step process sequence may be repeated as desired, e.g., up to about 4 times, in the manufacture of five metallization level, high-density integration semiconductor devices according to current design rules and methodology.

Referring now in greater detail to the photolytic (i.e., photo-activated) selective anisotropic etching process of FIG. 2(C), the gas 6 comprising at least one photo-activated etching material selected from halogens such as fluorine ($F_2$) and chlorine ($Cl_2$) gas or halogen-containing compounds such as HCl, $POCl_3$, $PCl_3$, $BCl_3$, $COCl_2$, etc., is supplied to the space between the exposure mask 5 and the metal layer 20 of the workpiece at a concentration and flow rate sufficient to provide a desired rate of etching as well as efficient removal of volatile etching products in the gas stream exiting the space. Exposure mask 5 is preferably made of an etch-resistant material, e.g., quartz; however, a material which slowly etches may be utilized provided its etching products are volatile and thus readily removed in the exiting gas stream.

It is also a feature of the inventive method, wherein it is desired to form submicrondimensioned metal patterns, that the light 7 employed for the selective photo-activated etching be of sufficiently short wavelength as to provide the desired pattern resolution and feature sizes. Accordingly, short wavelength light 7 in the ultraviolet (UV) portion of the electromagnetic spectrum is generally required for practice of the inventive method, i.e. wavelengths below about 250 nm. The beam of radiation 7 from the source (not shown in the drawing for illustrative simplicity) is preferably collimated rather than point focussed or scanned, primarily in order to avoid deleterious effects due to local heating of substrate regions attendant upon the use of focussed, relatively high energy beams. Any convenient collimatable source of UV radiation of sufficient intensity is utilizable for practicing the method of the invention; the requisite beam intensity is readily correlated with the relevant factors such as the thickness of the metal layer to be etched, desired etching rate and particular photo-activatable etchant material, by one of ordinary skill in the art for use in a particular application and by recourse to the patents incorporated herein by reference. In addition, the irradiation 7 may be continuous or pulsed, as desired, for use in a particular application. In the case of pulsed irradiation 7, the flow 6 of photo-activatable etching gas may be similarly pulsed so as to replenish the gas, e.g., between consecutive irradiation pulses.

A variety of the previously enumerated metals such as are conventionally employed for forming "back-end" contacts and metallization patterns of integrated circuit semiconductor devices may be utilized with the method according to the instant invention, including, inter alia, titanium, tantalum, tungsten, molybdenum, aluminum, chromium, nickel, cobalt, palladium, silver, gold, and copper, and their alloys, with copper and its alloys being preferred.

Figure 3:
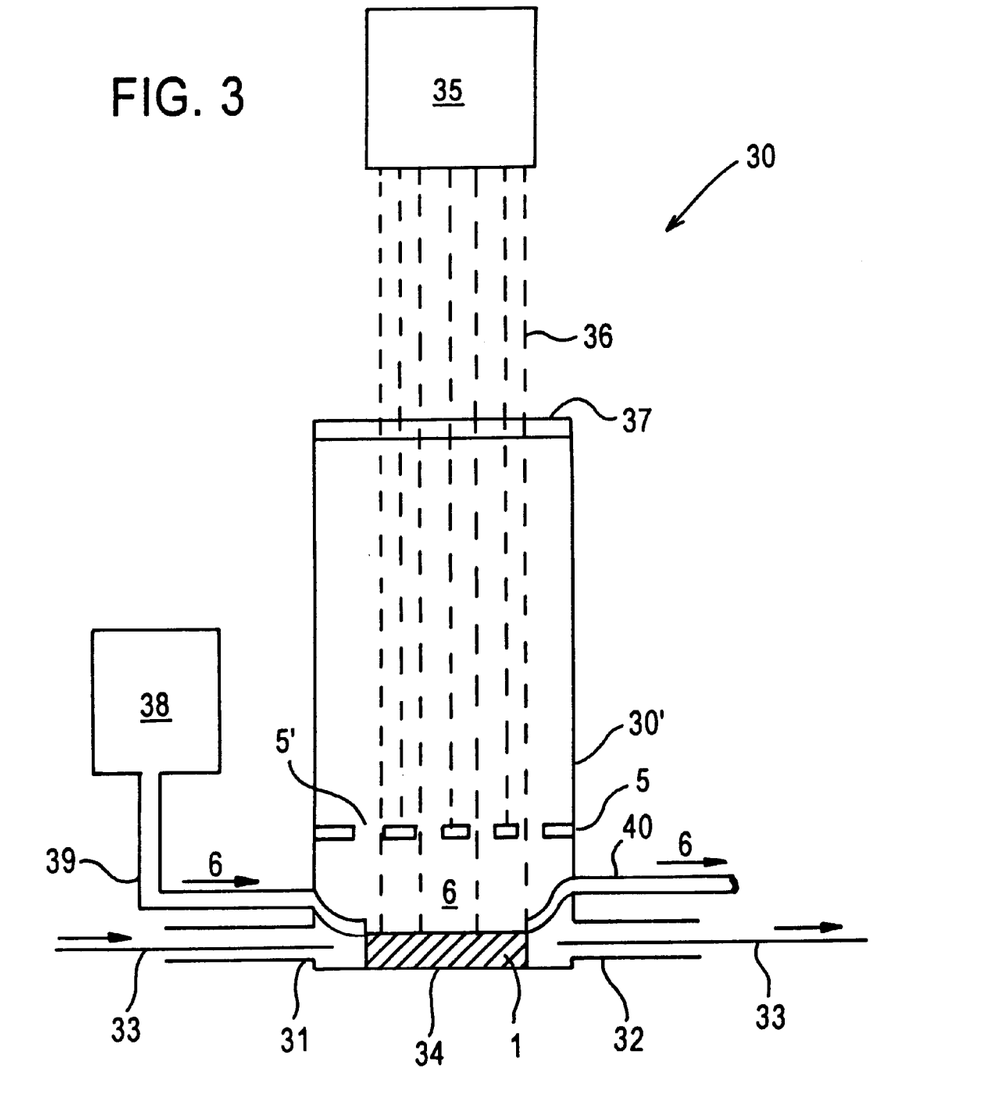
FIG. 3 illustrates, in simplified cross-sectional form, an apparatus for performing photo-activated, selective anisotropic etching of semiconductor wafers according to an embodiment of the present invention.

Referring now to FIG. 3, shown therein in schematic, cross-sectional form, is an illustrative, but non-limitative example of an in-line apparatus 30 suitable for performing selective photo-activated etching for forming patterned metal layers according to an embodiment of the present invention. Apparatus 30, when adapted for use as part of a continuous manufacturing line such as is conventional in semiconductor manufacture, comprises a photo-activation/etching chamber 30' having entrance and exit apertures 31 and 32, respectively, at opposite sides thereof for receiving and discharging semiconductor wafer substrates 1 supplied thereto and removed therefrom by a transport mechanism 33 of conventional design. Central area 34 of the chamber bottom wall includes means (not shown for illustrative simplicity) for accommodating and fixedly mounting wafer substrate 1 during photo-activated selective metal etching processing. A continuous or pulsed UV radiation source, of conventional type, is positioned above chamber 30' for providing a collimated beam 36 of UV radiation of wavelengths below about 250 nm for passage through fused silica window 37 at the upper end of chamber 30' and through the predetermined pattern of submicron-dimensioned openings 5' formed in exposure mask 5. A uniform flow 6 of photo-activatable etching gas over the upper surface of the wafer 1 comprising metal layer 20 is supplied from reservoir or tank 38 via supply conduit 39, the exit orifice of which is positioned at one edge of the wafer 1 and removed therefrom via withdrawal conduit 40, the entrance orifice of which is positioned at an opposite wafer edge.

The present invention thus enables rapid formation of reliable, defect-free, in-laid, multi-level "back-end" contacts and interconnections by providing a simplified process which results in a very significant reduction in the number of heretofore required process steps according to conventional methodology for forming high-density integration semiconductor devices. The inventive process also effects a substantial increase in manufacturing throughput by reducing the time and cost of conventional metal layer patterning vis-à-vis conventional methodology employing photolithographic masking and etching techniques.

The present invention is applicable to the formation of various types of submicrondimensioned metallization patterns, including, but not limited to, high aspect ratio in-laid metallization patterns employed in "back-end" processing of integrated circuit semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, which method comprises the sequential steps of:
   (a) providing a substrate comprising a semiconductor wafer with a surface having a dielectric layer fonned thereover, said dielectric layer comprising a surface including a first in-laid metallization pattern including a plurality of spaced-apait metal features forming electrical contacts, vias, interlevel metallization, and/or interconnect routing of at least one active device region or component of said semiconductor wafer substrate;
   (b) forming a layer of a preselected metal to a predetermined thickness over said surface of said dielectric layer and in ohmic contact with each of said plurality of spaced-apart metal features of said first in-laid metallization pattern said metal layer including a surface;
   (c) positioning a patterned exposure mask at a predetermined spacing from said surface of said metal layer, said mask comprising a predetermined pattern of openings formed therethrough, said mask openings being positioned in a predetermined registered relation with the features of said first in-laid metallization pattern;
   (d) establishing a gas atmosphere in the space between said surface of said metal layer and said patterned exposure mask, said gas atmosphere comprising at least one etchant material for photo-activated anisotropic etching of said metal layer;
   (e) irradiating the portions of said gas atmosphere exposed through said pattern of mask openings with radiation of predetermined wavelength(s) for effecting photo-activated, selective, anisotropic etching of the portions of said metal layer exposed through said pattern of mask openings; and
   (f) continuing said photo-activated selective anisotropic etching of step (e) for an interval sufficient to remove the entire thickness of said metal layer at said exposed portions, thereby forming a patterned metal layer having predetermined portions in overlying, ohmic contact with selected features of said first in-laid metallization pattern.

2. The method according to claim 1, further comprising the sequential steps of:
   (g) depositing a layer of a dielectric material filling gaps or spaces between adjacent portions of said patterned metal layer, said dielectric material layer being blanket-deposited in an excess thickness over said patterned metal layer; and
   (h) removing said excess thickness of said dielectric material layer and planarizing the surface thereof to form a second in-laid metallization pattern.

3. The method according to claim 2, further comprising repeating steps (b)–(h) n times to form n additional in-laid metallization patterns, wherein n is an integer from 1 to 15.

4. The method according to claim 1, wherein step (b) comprises forming a layer of a metal selected from the group consisting of titanium, tantalum, tungsten, molybdenum, aluminum, chromium, nickel, cobalt, palladium, silver, gold, copper, and alloys thereof.

5. The method according to claim 4, wherein said layer of metal is formed to a thickness of from about 4,000 to about 10,000 Å.

6. The method according to claim 4, wherein said layer of metal is formed by a process selected from the group consisting of electroplating, electroless plating, physical vapor deposition (PVD), chemical vapor deposition (CVD), plasma-enhanced CVD (PECVD), and combinations thereof.

7. The method according to claim 3, wherein each of said in-laid metallization patterns includes submicron-dimensioned metal features having widths less than about 0.40 $\mu$m, depths of from about 4,000 to about 10,000 Å, and interline spacings of from about 0.10 to about 0.40 $\mu$m.

8. The method according to claim 7, wherein said widths of said metal features are less than about 0.27 $\mu$m.

9. The method according to claim 7, wherein step (c) comprises positioning a patterned exposure mask at a spacing from said surface of said metal layer of about 1 meter.

10. The method according to claim 3, wherein step (d) comprises establishing a gas atmosphere comprising at least one photo-activated anisotropic etchant material selected from the group consisting of halogens and halogen-containing compounds.

11. The method according to claim 10, wherein step (e) comprises irradiating said exposed portions of said at least one said photo-activated etchant material with collimated radiation having wavelengths in the ultra-violet (UV) region of the electromagnetic spectrum.

12. The method according to claim 11, wherein step (e) comprises continuously irradiating said exposed portions of said etchant material.

13. The method according to claim 11, wherein step (e) comprises pulse irradiating said exposed portions of said etchant material.

14. The method according to claim 13, wherein step (further comprises replenishing said etchant material between consecutive pulses.

15. The method according to claim 2, wherein step (g) comprises depositing a blanket layer of a dielectric material having a dielectric constant below about 3.9.

16. The method according to claim 15, wherein step (g) comprises depositing a layer of a low dielectric constant material selected from the group consisting of hydrogen silsesquioxane (HSQ), benzocyclobutene (BCB), polytetrafluoroethylene (TEFLON™), parylene, polyimide, and a xerogel.

17. The method according to claim 16, wherein step (h) comprises removing said excess thickness of said layer of low dielectric constant material and planarizing the surface thereof by a chemical-mechanical polishing (CMP) process.

18. The method according to claim 2, wherein step (a) comprises providing a monocrystalline silicon wafer substrate.

19. The method according to claim 18, further comprising repeating steps (b)–(h) n times to form n additional in-laid metallization patterns, wherein n is an integer from 1 to 15.

* * * * *

UNITED STATES PATENT AND TRADEMARK OFFICE
CERTIFICATE OF CORRECTION

PATENT NO. : 6,207,553 B1
DATED : March 27, 2001
INVENTOR(S) : Matthew S. Buynoski, et al.

It is certified that error appears in the above-identified patent and that said Letters Patent is hereby corrected as shown below:

Claim 1.(a),
Line 2, change " fonned" to -- formed --;
Line 5, change "spaced-apait" to -- spaced-apart --.

Claim 14,
Line 1, after "step", insert -- (e) --;
Line 2, delete "(".

Signed and Sealed this

Sixteenth Day of October, 2001

Attest:

NICHOLAS P. GODICI
Attesting Officer
Acting Director of the United States Patent and Trademark Office